United States Patent
Lakshmanan et al.

(10) Patent No.: US 8,296,714 B2
(45) Date of Patent: Oct. 23, 2012

(54) SYSTEM AND METHOD FOR CHECKING ANALOG CIRCUIT WITH DIGITAL CHECKER

(75) Inventors: Guha Lakshmanan, Bangalore Karnataka (IN); Sudhind Dhamankar, Richardson, TX (US); Vipin Sharma, San Jose, CA (US); Sandeep Tare, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 159 days.

(21) Appl. No.: 12/580,717

(22) Filed: Oct. 16, 2009

(65) Prior Publication Data

US 2010/0097072 A1    Apr. 22, 2010

Related U.S. Application Data

(60) Provisional application No. 61/105,872, filed on Oct. 16, 2008.

(51) Int. Cl.
G06F 17/50 (2006.01)
G06F 11/22 (2006.01)
G01R 31/02 (2006.01)
(52) U.S. Cl. ........................ 716/136; 324/537
(58) Field of Classification Search .................. 716/136; 324/537
See application file for complete search history.

(56) References Cited

U.S. PATENT DOCUMENTS

2006/0195744 A1 * 8/2006 Petersen ...................... 714/741

* cited by examiner

*Primary Examiner* — Jack Chiang
*Assistant Examiner* — Magid Dimyan
(74) *Attorney, Agent, or Firm* — Ronald O. Neerings; Wade James Brady, III; Frederick J. Telecky, Jr.

(57) ABSTRACT

Aspects of the present invention provide a system and method for checking a portion of an analog circuit using a digital checker. The method includes establishing a target in the analog circuit, creating an analog target dummy for the target, creating a digital target dummy, binding the digital target dummy to the analog target dummy, and checking a value of the digital target dummy with a digital checker.

22 Claims, 9 Drawing Sheets

SYSTEM AND METHOD FOR CHECKING ANALOG CIRCUIT WITH DIGITAL CHECKER

The present application claims priority from U.S. Provisional Application No. 61/105,872 filed Oct. 16, 2008, the entire disclosure of which is incorporated herein by reference.

BACKGROUND

A part of the circuit design process involves creating a virtual circuit representative of the intended design. This virtual circuit simulates the responses of the design to given circuit inputs. Virtual circuits may be created using any known circuit simulation software, non-limiting examples of which include Spice™.

Figure 1:
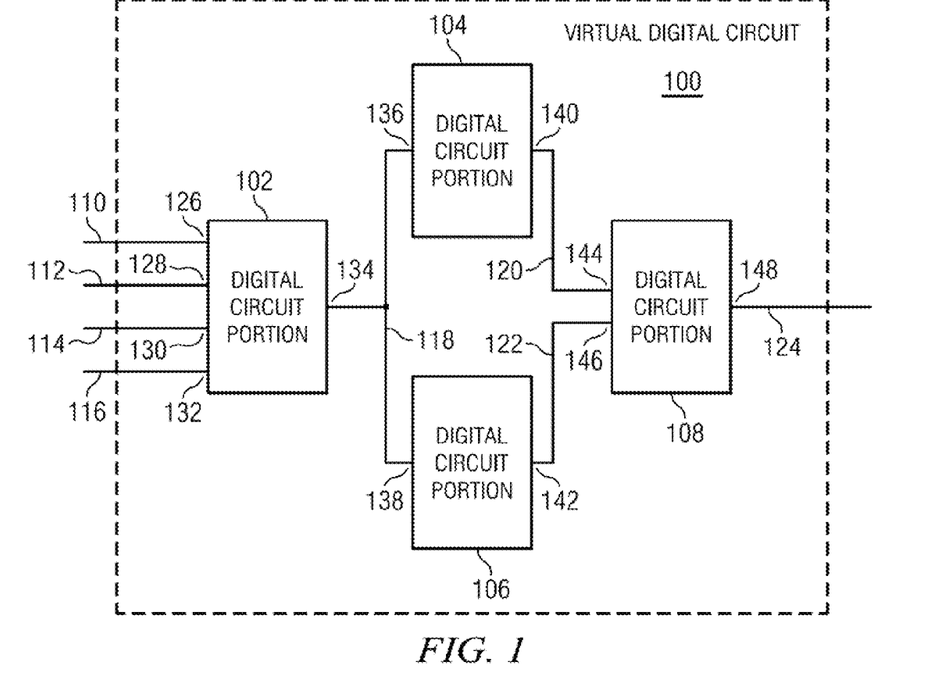
FIG. 1 illustrates a block diagram of a virtual digital circuit.

FIG. 1 illustrates a block diagram of a virtual digital circuit 100.

As illustrated in the figure, virtual digital circuit 100 includes digital circuit portion 102, digital circuit portion 104, digital circuit portion 106 and digital circuit portion 108.

Digital circuit portion 102 is arranged to receive a digital signal 110, a digital signal 112, a digital signal 114 and a digital signal 116 and to output a digital signal 118. Digital circuit portion 104 is arranged to receive digital signal 118 and to output a digital signal 120. Circuit portion 106 is arranged to receive digital signal 118 and to output a digital signal 122. Circuit portion 108 is arranged to receive digital signal 120 and digital signal 122 and to output a digital output 124.

In operation, virtual digital circuit 100 receives a digital value from digital signal 110, digital signal 112, digital 114 and digital signal 116, and creates digital signal 124 based on the given input values. Circuit portions are smaller parts of the larger digital circuit. Digital circuit portion 102 receives a digital value from digital signal 110 through a digital input 126, a digital value from digital signal 112 through a digital input 128, a digital value from digital signal 114 through a digital input 130 and a digital value from digital signal 116 through a digital input 132. Digital circuit portion 102 outputs digital signal 118 through a digital output 134. Digital circuit portion 104 receives a digital value from digital signal 118 through a digital input 136 and outputs digital signal 120 through a digital output 140. Digital circuit portion 106 receives a digital value from digital signal 118 through a digital input 138 and outputs digital signal 122 through a digital output 142. Digital circuit portion 108 receives a digital value from digital signal 120 through a digital input 144 and receives a digital value from digital signal 122 through a digital input 146, and outputs digital signal 124 through a digital output 148.

Before proceeding to the manufacturing phase, the circuit design process includes the layout and test of a virtual circuit representative of the intended circuit design. Therefore, before a digital circuit corresponding to a virtual digital circuit can be manufactured, operation of the virtual digital circuit is tested, while in virtual operation. This is done by monitoring the states of targets in response to circuit inputs. A target can be any point, or node, in the circuit, non-limiting examples of which include, leads on a resistor and pins on an integrated circuit (IC) chip.

The targets of a digital virtual circuit are monitored using a digital checker. A digital checker can be software capable of monitoring stated targets in a virtual digital circuit. The testing portion of this process is further described in reference to FIG. 2.

Figure 2:
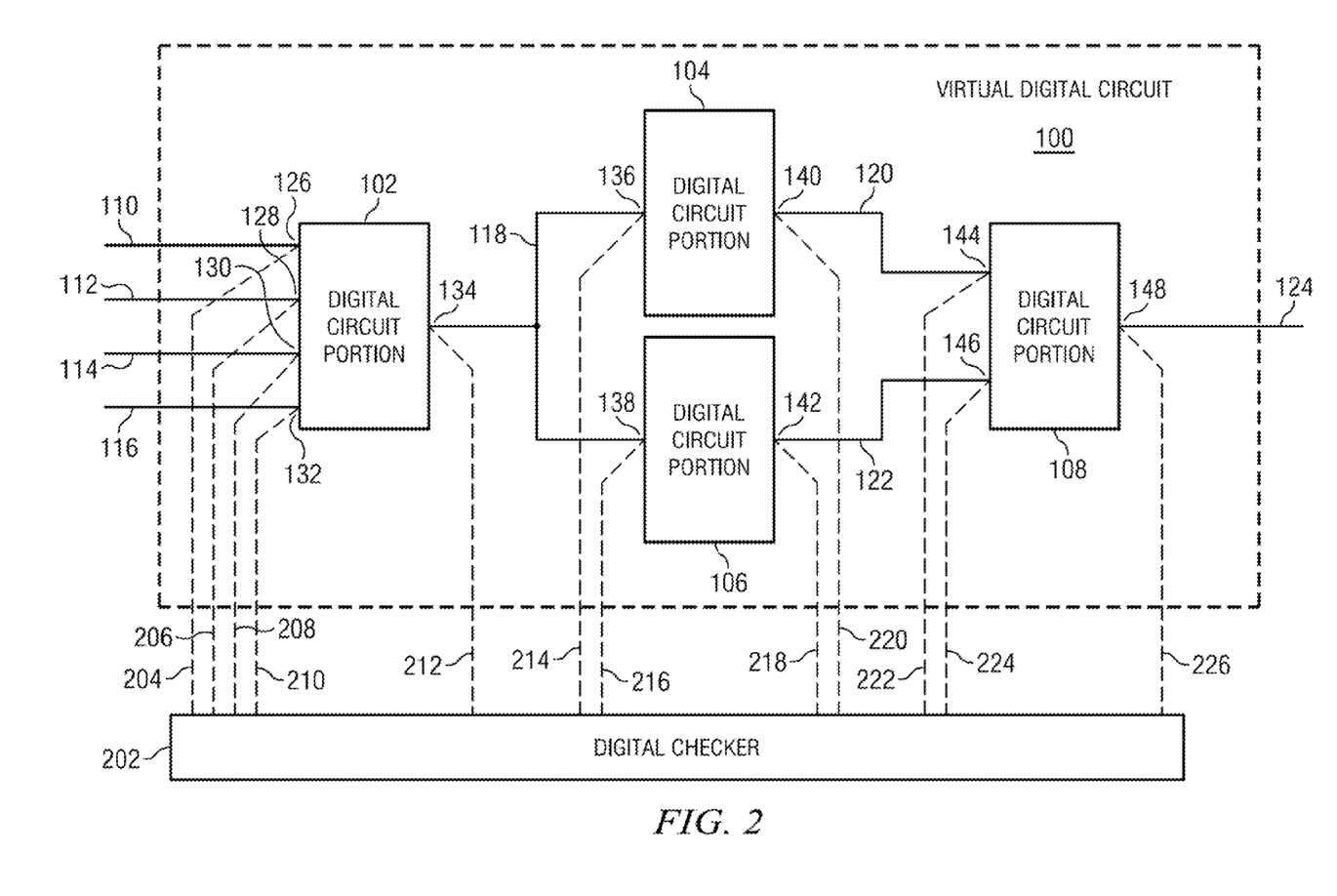
FIG. 2 illustrates a conventional digital checker arranged to check a virtual digital circuit.

FIG. 2 illustrates a conventional digital checker arranged to check virtual digital circuit 100.

A digital checker 202 is programmed to monitor states of various portions of virtual digital circuit 100. Each portion of virtual digital circuit 100 that digital checker 202 will monitor is referred to as a target. A target may be an input/output of a high level of a portion of a digital circuit, such as an amplifier. A target may be an input/output of a lower level of a digital circuit, such as a flip-flop within an amplifier. Further, a target may be an input/output of a device level portion of a digital circuit, such as a transistor in a flip-flop within an amplifier.

For purposes of explanation, in this example, presume that inputs and outputs of digital circuit portions of virtual digital circuit 100 are to be checked by digital checker 202. As illustrated in FIG. 2, digital circuit portion 102 includes a digital input 126 arranged to receive digital signal 110, a digital input 128 arranged to receive digital signal 112, a digital input 130 arranged to receive digital signal 114, a digital input 132 arranged to receive digital signal 116 and a digital output 134 arranged to output digital signal 118. Digital circuit portion 104 includes a digital input 136 arranged to receive digital signal 118 and a digital output 140 arranged to output digital signal 120. Digital circuit portion 106 includes a digital input 138 arranged to receive digital signal 118 and a digital output 142 arranged to output digital signal 122. Digital circuit portion 108 includes a digital input 144 arranged to receive digital signal 120, a digital input 146 arranged to receive digital signal 122 and a digital output 148 arranged to output digital signal 124.

As illustrated in FIG. 2, digital checker 202 is programmed such that the digital target associated with digital input 126 is arranged to be checked as represented by line 204. The digital target associated with digital input 128 is arranged to be checked as represented by line 206. Digital target associated with digital input 130 is arranged to be checked as represented by line 208. Digital target associated with digital input 132 is arranged to be checked as represented by line 210. Digital target associated with digital input 134 is arranged to be checked as represented by line 212. Digital target associated with digital input 136 is arranged to be checked as represented by line 214. Digital target associated with digital input 138 is arranged to be checked as represented by line 216. Digital target associated with digital input 140 is arranged to be checked as represented by line 220. Digital target associated with digital input 142 is arranged to be checked as represented by line 218. Digital target associated with digital input 144 is arranged to be checked as represented by line 222. Digital target associated with digital input 146 is arranged to be checked as represented by line 224. Digital target associated with digital input 148 is arranged to be checked as represented by line 226.

In operation, one input value is applied to digital input 110, one input value to digital input 112, one input value to digital input 114 and one input value to digital input 116. Since this is a digital design, input values are either 1 or 0. As each input value is applied, the states of all targets are monitored by the digital checker. For example, presume that a digital value of 1 is applied to digital input 126, a digital value of 1 is applied to digital input 128, a digital value of 0 is applied to digital input 130 and a digital value of 0 is applied to digital input 132.

Further, presume that ideally, in this example, on these provided inputs and based on the ideal operation of digital circuit portion 102, the ideal operation of digital circuit portion 104, the ideal operation of digital circuit portion 106 and the ideal operation of digital circuit portion 108, digital output 134 should have a digital value of 1, digital input 136 should have a digital value of 1, digital input 138 should have a digital value of 1, digital output 140 should have a digital value of 1, digital output 142 should have a digital value of 0, digital input 144 should have a digital value of 1, digital input 146 should have a digital value of 0 and digital output 148 should have a digital value of 1.

However, presume in this example that digital circuit portion 106 is designed incorrectly, therefore the actual digital value of output 142 is 0.

When checking digital circuit 100, digital checker 202 will check the targets as it has been preprogrammed to check. In particular, digital checker will verify that digital input 126 has a value of 1, digital input 128 has a value of 1, digital input 130 has a value of 0 and digital input 132 has a value of 0 as represented by line 204, line 206, line 208 and line 210, respectively. Digital checker 202 will verify that digital output 134 has a value of 1 as represented by line 212. Digital checker 202 will verify that digital input 136 has a value of 1 by way of line 214. Digital checker 202 will verify that digital input 138 has a value of 1 by way of line 216. Digital checker 202 will verify that digital output 140 has a value of 1 by way of line 220. Digital checker 202 will verify that digital output 142 has a value of 0 by way of line 218. Digital checker 202 will verify that digital input 144 has a value of 1 by way of line 222. Digital checker 202 will verify that digital input 146 has a value of 0 by way of line 224. Digital checker 202 will verify that digital output 148 has a value of 1 by way of line 226. Here, the lines, for example line 210, illustrates a connection that digital checker 202 would have with a target in the case where digital checker 202 is software program and digital circuit 100 is a virtual circuit, the line may be a programmed association. In the case where digital checker 202 is a device, and digital circuit 100 is a real circuit, the line may be a wired probe.

In this example, digital checker will compare the monitored value of the targets with the ideal value corresponding to the given inputs. Presume in this example that digital circuit portion 106 outputs a value of 1 as opposed to the expected value of 0. During this comparison, digital checker 202 will determine that the monitored digital value of 1 at output 142 does not correspond to the expected digital value of 0 that corresponds to the provided digital input values of 1, 1, 0, and 0 as checked by lines 204, 206, 208 and 210, respectively. In such an event, digital checker 202 will provide an indication that there is an error in virtual digital circuit 100 at output 142 and the circuit designer can take steps accordingly.

The checking process involves monitoring target states and comparing those states to the expected states corresponding to all possible input values for virtual digital circuit 100. A complete list of all possible digital input values for a virtual digital circuit to be checked is called a test bench. This is further explained using FIG. 3.

Figure 3:
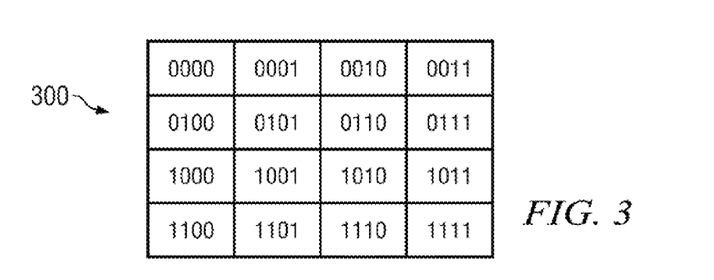
FIG. 3 illustrates an example of a digital test bench.

FIG. 3 illustrates an example of a digital test bench 300.

As illustrated in the figure, digital test bench 300 includes 16 possible inputs for virtual digital circuit 100.

For example, a digital input value of "0110" corresponds to digital input 110 having a value of 0, digital input 112 having a value of 1, digital input 114 having a value of 1, and digital input 116 having a value of 0. As discussed in the example above, these digital inputs are sent through virtual digital circuit 100 and the states of targets are monitored and compared with expected values corresponding to a digital input value of 0110.

Virtual digital circuit 100 of FIG. 1 is merely provided for explanation. In actuality, circuits are more complex, with many more targets and a much larger test bench. Accordingly, a pseudorandom number generator (not shown) may be used to generate pseudorandom inputs. When the pseudorandom number generator generates an input that is part of the test bench, it is noted until the entire test bench has been generated.

Figure 4:
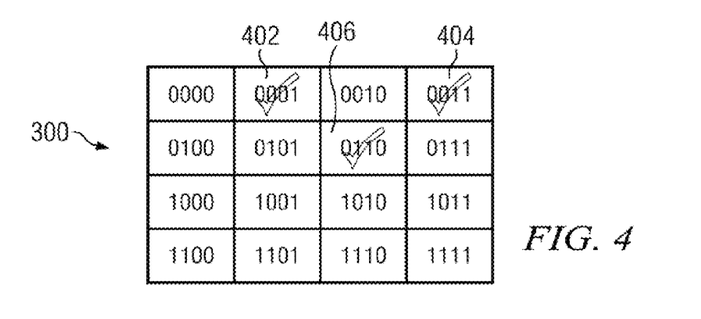
FIG. 4 illustrates the digital test bench of FIG. 3, after the checker has been running for a time T.

One of the other functions of the digital checker is to monitor the test bench. Once the test bench is created, and the digital checker is monitoring the inputs, when one of the input values included in the test bench has been given to virtual digital circuit 100 the digital checker notes that the input value has been used. FIG. 4 is used to further illustrate this function.

FIG. 4 illustrates test bench 300, after the checker has been running for a time T Specifically, in this example, assume that pseudorandom number generator has generated a plurality of pseudo random input values. Of this plurality of pseudorandom digital input values, digital input values corresponding to reference number 402, 404 and 406 have been generated. Further, and with reference to FIG. 2, digital checker 202 has verified that input value 0001 has been generated by monitoring digital input 126, digital input 128, digital input 130 and digital input 132 by way of lines 204, 206, 208 and 210, respectively. Digital checker 202 has verified that input value 0011 has been generated by monitoring digital input 126, digital input 128, digital input 130 and digital input 132 by way of lines 204, 206, 208 and 210, respectively. Digital checker 202 has verified that input value 0110 has been generated by monitoring digital input 126, digital input 128, digital input 130 and digital input 132 by way of lines 204, 206, 208 and 210, respectively. After having verified that each value is provided to these inputs, the checker notes that these input values have been used. For purposes of illustration, this is indicated with a check mark in FIG. 4.

As illustrated in FIG. 4, values "0001", "0110" and "0011" have been checked off. This signifies that digital checker 202 has monitored all targets when digital inputs were 0001, 0110 and 0011. Since all values in the test bench have not been checked off, digital checker 202 will continue to send inputs and monitor targets. Once all values in the test bench have been checked off, digital checker 202 will stop.

However, conventional digital checkers are unable to check analog circuits.

As discussed above, each portion of a digital circuit will have a digital value at any state of either a 0 or a 1. Further, the digital checkers are only able to monitor a digital state of 0 or 1. However, each portion of an analog circuit will have one of two states, an OFF state or an ON state. Each of these states will have two different values that are distinguishable from each other.

Figure 5:
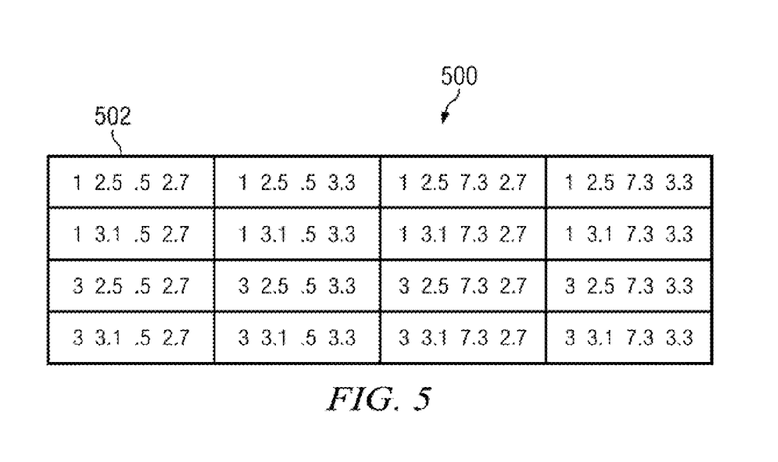
FIG. 5 illustrates an example of an analog test bench of an example analog virtual circuit.

FIG. 5 illustrates an example of an analog test bench 500 of an example analog virtual circuit.

In this example, presume that: a first bit has an OFF state associated with a value 1 and an ON state with a value of 3; a second bit has an OFF state associated with a value 2.5 and an ON state with a value of 3.1; a third bit has an OFF state associated with a value 0.5 and an ON state with a value of 7.3; and a fourth bit has an OFF state associated with a value 2.7 and an ON state with a value of 3.3. For example, the input value of item 502 of test bench 500 will have four OFF states of values of 1, 2.5, 0.5, 2.7. In this case, digital checker 202 would incorrectly recognize the first bit value of 1 as an ON state. Further, digital checker 202 would be unable to recognize values second through fourth bit values, because these values are neither a 1 or 0.

What is needed is system and method to check virtual analog circuits using a digital checkers.

BRIEF SUMMARY

Aspects of the present invention provide a system and method to check virtual analog circuits using a digital checker.

In accordance with an aspect of the present invention, a system and method are provided for checking a portion of an analog circuit using a digital checker. The method includes establishing a target in the analog circuit, creating an analog target dummy for the target, creating a digital target dummy, binding the digital target dummy to the analog target dummy, and checking a value of the digital target dummy with a digital checker.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with an aspect of the present invention, targets in a virtual analog circuit may be checked by: 1) assigning an analog target dummy to each analog target: 2) creating a digital target dummy for every analog target dummy target, respectively; 3) binding each digital target dummy to its corresponding analog target dummy; 4) binding the digital target dummies to a digital checker; and 5) and checking the analog virtual circuit with the digital checker.

In other words, in accordance with an aspect of the present invention, each analog target dummy is associated with a specific analog target in the analog circuit. Further, each digital target dummy is associated with a corresponding analog target dummy. Accordingly, each digital target dummy will have insight into a respective virtual analog target by way of its bound analog target dummy. A digital checker is able to check the digital target dummies. Therefore, the digital checker is able to check the virtual analog target within the virtual analog circuit by way of the association of the digital target dummy and the analog target dummy.

An example embodiment will now be described in greater detail with reference to FIGS. 6-14C.

Figure 6:
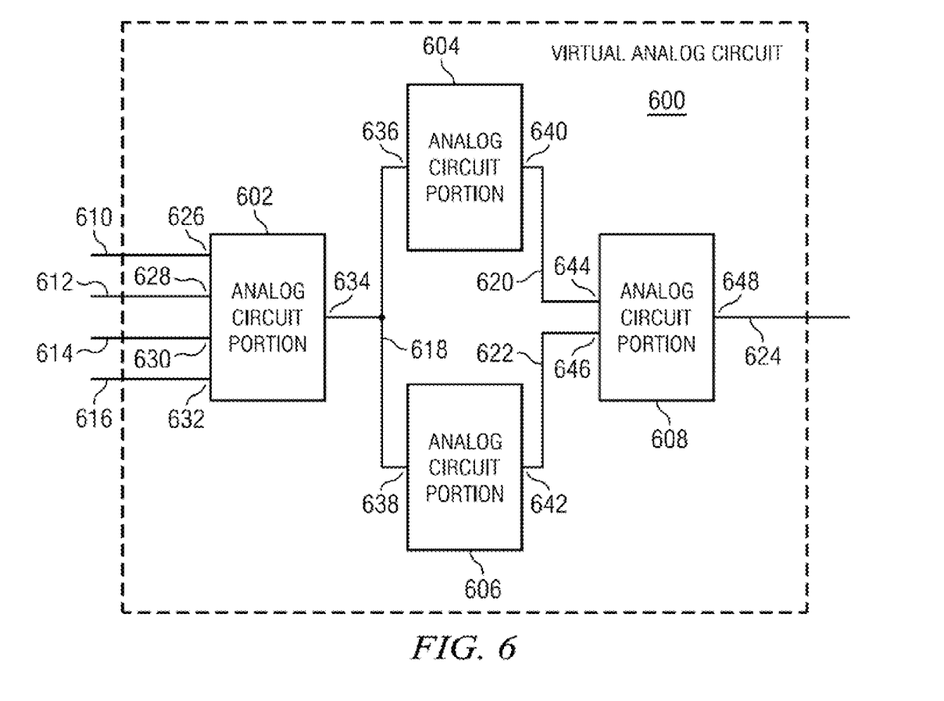
FIG. 6 illustrates a block diagram of an example virtual analog circuit.

FIG. 6 illustrates a block diagram of an example virtual analog circuit 600.

As illustrated in the figure, virtual analog circuit 600 includes analog circuit portion 602, analog circuit portion 604, analog circuit portion 606, and analog circuit portion 608.

Analog circuit portion 602 is arranged to receive an analog signal 610, an analog signal 612, an analog signal 614 and an analog signal 616 and to output an analog signal 618. Analog circuit portion 604 is arranged to receive an analog signal 618 and to output an analog signal 620. Analog circuit portion 606 is arranged to receive an analog signal 618 and to output an analog signal 622. Analog circuit portion 608 is arranged to receive an analog signal 620 and an analog signal 622, and to output an analog signal 624.

In operation, virtual analog circuit 600 receives an analog value from analog signal 610, analog signal 612, analog 614 and analog signal 618, and creates analog signal 624 based on the given input values. Circuit portions are smaller parts of the larger analog circuit. Analog circuit portion 602 receives an analog value from analog signal 610 through an analog input 626, an analog value from analog signal 612 through an analog input 628, an analog value from analog signal 614 through an analog input 630 and an analog value from analog signal 616 through an analog input 632. Analog circuit portion 602 outputs analog signal 618 through an analog output 634. Analog circuit portion 604 receives an analog value from analog signal 618 through an analog input 636 and outputs analog signal 620 through an analog output 640. Analog circuit portion 606 receives an analog value from analog signal 618 through an analog input 638 and outputs analog signal 622 through an analog output 642. Analog circuit portion 608 receives an analog value from analog signal 620 through an analog input 644 and receives an analog value from analog signal 622 through an analog input 646, and outputs analog signal 624 through an analog output 648.

Once created, the design of virtual analog circuit 600 must be checked. An example embodiment system and method of checking a virtual analog circuit in accordance with aspects of the present invention will now be further explained with reference to FIG. 7.

Figure 7:
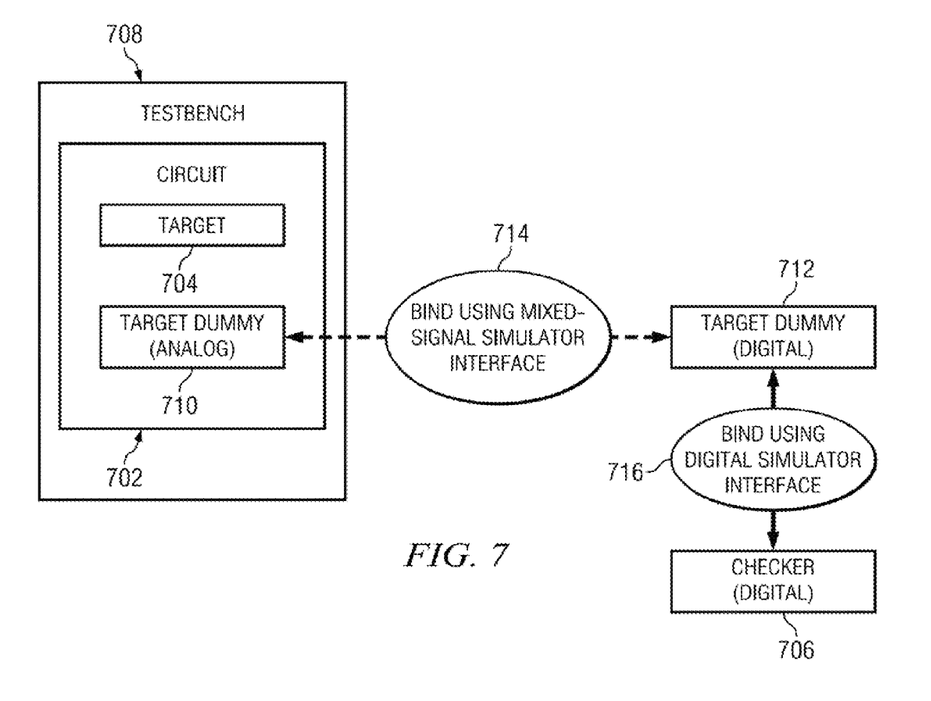
FIG. 7 illustrates a block diagram of a method for linking analog targets to a digital checker, in accordance with an aspect of the present invention.

FIG. 7 illustrates a block diagram of a method for linking analog targets to a digital checker, in accordance with an aspect of the present invention.

As illustrated in the figure, item 702 represents a virtual analog circuit to be checked. Item 706 corresponds to a digital checker that will be used to check virtual analog circuit 702. Item 704 represents the list of analog targets within virtual analog circuit that are to be checked. Item 708 corresponds to the analog test bench. Item 710 corresponds to analog target dummies, as will be described in greater detail below. Item 712 corresponds to digital target dummies, as will be described in greater detail below.

Once virtual analog circuit 702 is created, it is determined which parts need to be checked. These parts are marked as analog targets and are included in the list of analog targets 704. Further, the analog test bench is created, item 708, which defines all of the possible analog input values for the virtual analog circuit 702, and defines all of the expected values for the targets for each corresponding input value in test bench 708. However, as opposed to the digital circuits discussed above, in this situation, at least one of the values in the test bench is going to be a value other than 0 or 1. Further, at least one of the ideal expected values of the targets corresponding an input value in the test bench will be a value other that a 0 or a 1.

Digital checker 706 is only able to check digital values of 0 or 1. In accordance with an aspect of the present invention, analog target dummies 710 in conjunction with digital target dummies 712 enable digital checker 706 to check analog targets in the list of analog targets 704.

Specifically, an analog target dummy is created for each analog target. That is, each target in the list of analog targets 704 has an associated analog target dummy in analog target dummies 710. Further, a digital target dummy is created for each analog target dummy. That is, for each analog target dummy in analog target dummies 710 there is an associated digital target dummy in digital target dummies 712.

Then, analog target dummies 710 are bound to the respected digital target dummies 712 using a mixed signal simulator interface 714. Any known mixed signal simulator interface may be used. At this point, the digital checker 706 is bound to digital target dummies 712 using a digital simulator interface 716. Any known digital simulator interface may be used.

Figure 8:
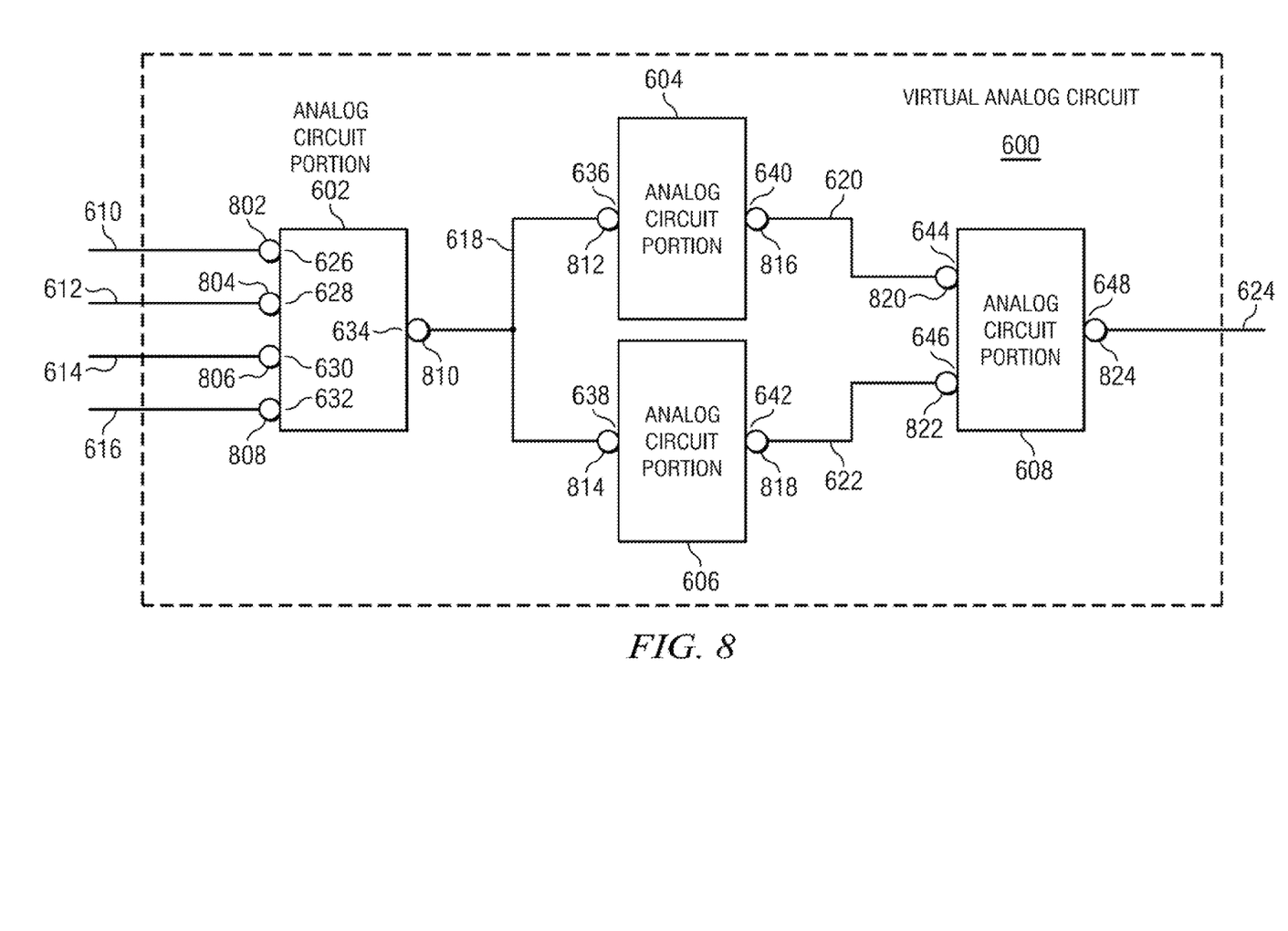
FIG. 8 illustrates an association of analog target dummies to the virtual analog circuit of FIG. 6, in accordance with an aspect of the present invention.
Figure 9:
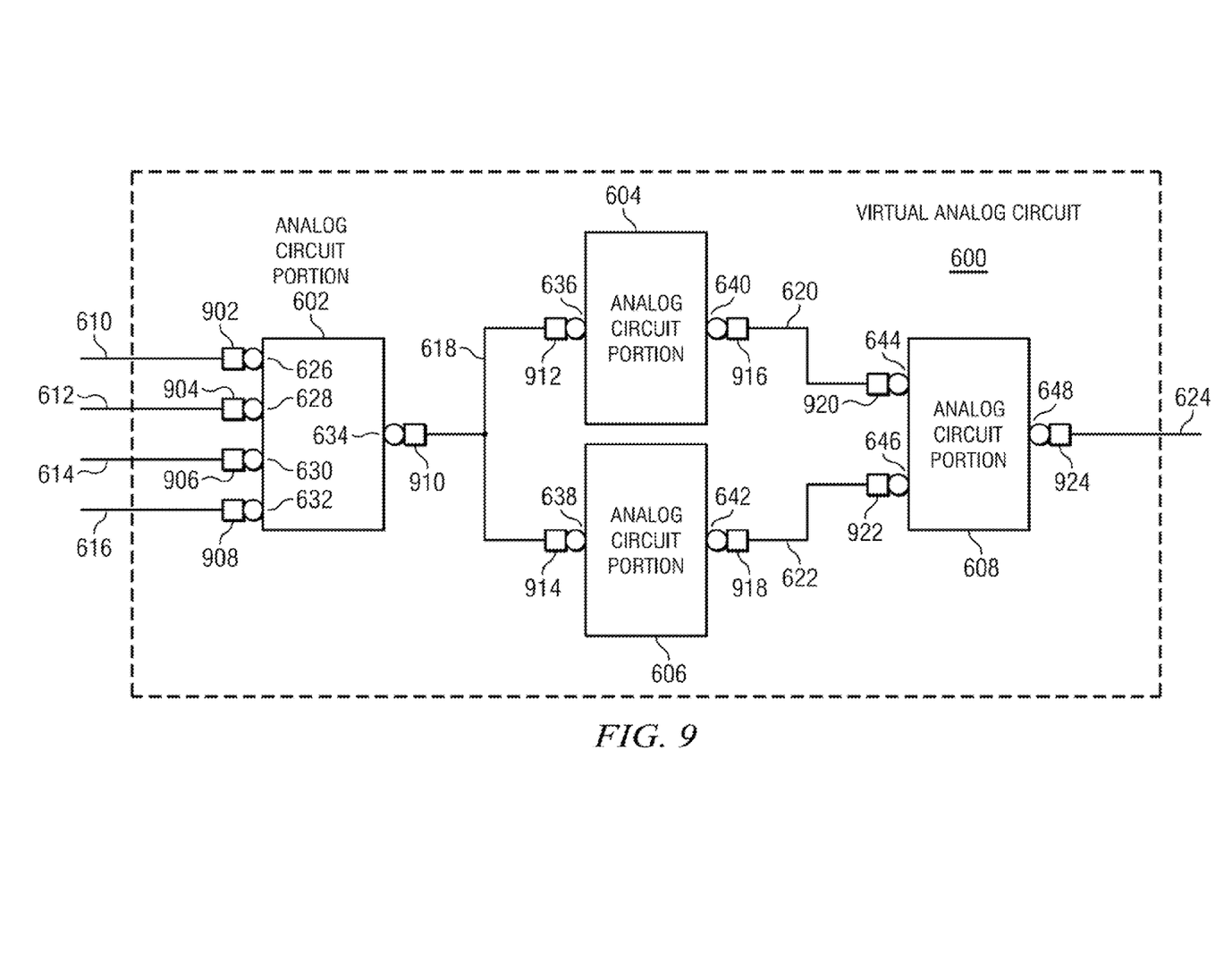
FIG. 9 illustrates an association of digital target dummies to analog target dummies of FIG. 8.
Figure 10:
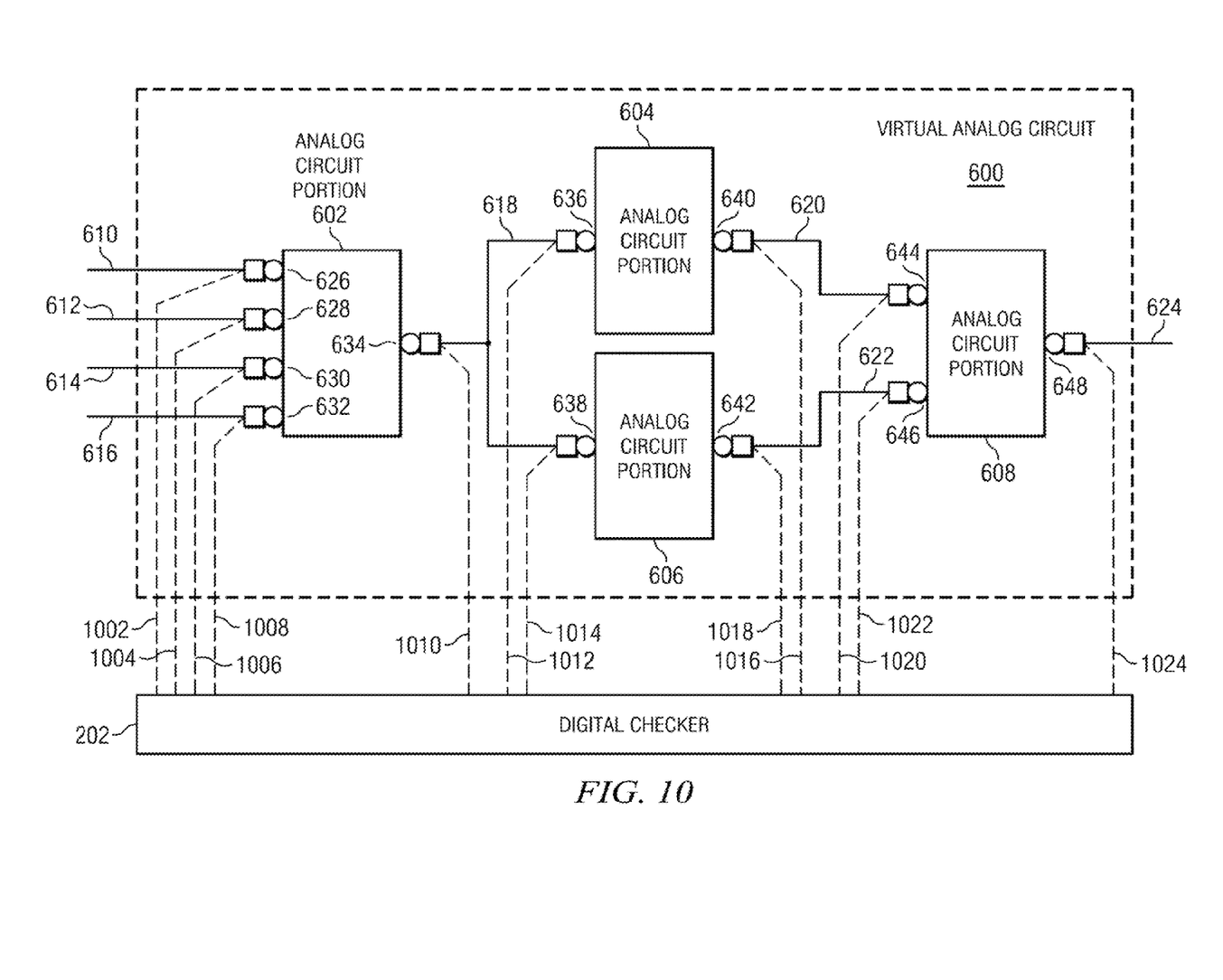
FIG. 10 illustrates the application of digital checker 202 to the virtual analog circuit of FIG. 6, in accordance with an aspect of the present invention.

At this point, target analog dummies 710 are linked to the analog targets within the list of analog targets 704. Further, the digital target dummies 712 are bound to analog target dummies 710. Still further, digital checker-706 is bound to the digital target dummies in item 712. As such, digital checker 706 is able to check digital target dummies 712, which correspond with analog target dummies 710, which correspond to analog targets in item 704. FIG. 8, FIG. 9 and FIG. 10 provide a visual representation of the associations between analog targets, analog target dummies, digital target dummies and the digital checker.

FIG. 8 illustrates an association of analog target dummies to virtual analog circuit 600, in accordance with an aspect of the present invention.

As illustrated in the figure, analog target dummy 802 corresponds to the analog target associated with analog input 626. Analog target dummy 804 corresponds to the analog target associated with analog input 628. Analog target dummy 806 corresponds to the analog target associated with analog input 630. Analog target dummy 808 corresponds to the analog target associated with analog input 632. Analog target dummy 810 corresponds to the analog target associated with analog output 634. Analog target dummy 812 corresponds to the analog target associated with analog input 636. Analog target dummy 814 corresponds to the analog target associated with analog input 638. Analog target dummy 816 corresponds to the analog target associated with analog output 640. Analog target dummy 818 corresponds to the analog target associated with analog output 642. Analog target dummy 820 corresponds to the analog target associated with analog input 644. Analog target dummy 822 corresponds to the analog target associated with analog input 646. Analog target dummy 824 corresponds to the analog target associated with analog output 648.

FIG. 9 illustrates an association of digital target dummies to analog target dummies of FIG. 8.

As illustrated in FIG. 9, digital target dummy 902 corresponds to analog target dummy 802. Digital target dummy 904 corresponds to analog target dummy 804. Digital target dummy 906 corresponds to analog target dummy 806. Digital target dummy 908 corresponds to analog target dummy 808. Digital target dummy 910 corresponds to analog target dummy 810. Digital target dummy 912 corresponds to analog target dummy 812. Digital target dummy 914 corresponds to analog target dummy 814. Digital target dummy 916 corresponds to analog target dummy 816. Digital target dummy 918 corresponds to analog target dummy 818. Digital target dummy 920 corresponds to analog target dummy 820. Digital target dummy 922 corresponds to analog target dummy 822. Digital target dummy 924 corresponds to analog target dummy 824.

FIG. 10 illustrates the application of digital checker 202 to virtual analog circuit 600, in accordance with an aspect of the present invention.

As illustrated in the figure, digital target dummy 902 is arranged to be checked by digital checker 202 as represented by line 1002. Digital target dummy 904 is arranged to be checked by digital checker 202 as represented by line 1004. Digital target dummy 906 is arranged to be checked by digital checker 202 as represented by line 1006. Digital target dummy 908 is arranged to be checked by digital checker 202 as represented by line 1008. Digital target dummy 910 is arranged to be checked by digital checker 202 as represented by line 1010. Digital target dummy 912 is arranged to be checked by digital checker 202 as represented by line 1012. Digital target dummy 914 is arranged to be checked by digital checker 202 as represented by line 1014. Digital target dummy 916 is arranged to be checked by digital checker 202 via line 1016. Digital target dummy 918 is arranged to be checked by digital checker 202 as represented by line 1018. Digital target dummy 920 is arranged to be checked by digital checker 202 as represented by line 1020. Digital target dummy 922 is arranged to be checked by digital checker 202 as represented by line 1022. Digital target dummy 924 is arranged to be checked by digital checker 202 as represented by line 1024.

Presume that analog test bench 500 of FIG. 5 is used for virtual analog circuit 600. Further, presume that the states of the targets within virtual analog circuit are checked with the input value of item 502. In other words, analog value of 1 is applied to analog signal 610, an analog value of 2.5 is applied to analog signal 612, an analog value of 0.5 is applied to analog 614 and an analog value of 2.7 is applied to analog signal 618.

In this case, analog target dummy 802 is associated with analog input 626. Further, digital target dummy 902 is bound to analog target dummy 802. Accordingly, digital target dummy 902 would "translate" the analog OFF value at analog input 626 as a digital OFF value. Therefore, digital target dummy 902 would register the analog value 1 at analog input 626 as a digital value 0. At this point, digital checker 202 would view the analog value of 1 at input 626 as a digital value 0 by way of line 1002. A similar translation would take place for each analog value at each analog target within virtual analog circuit 600.

Figure 11:
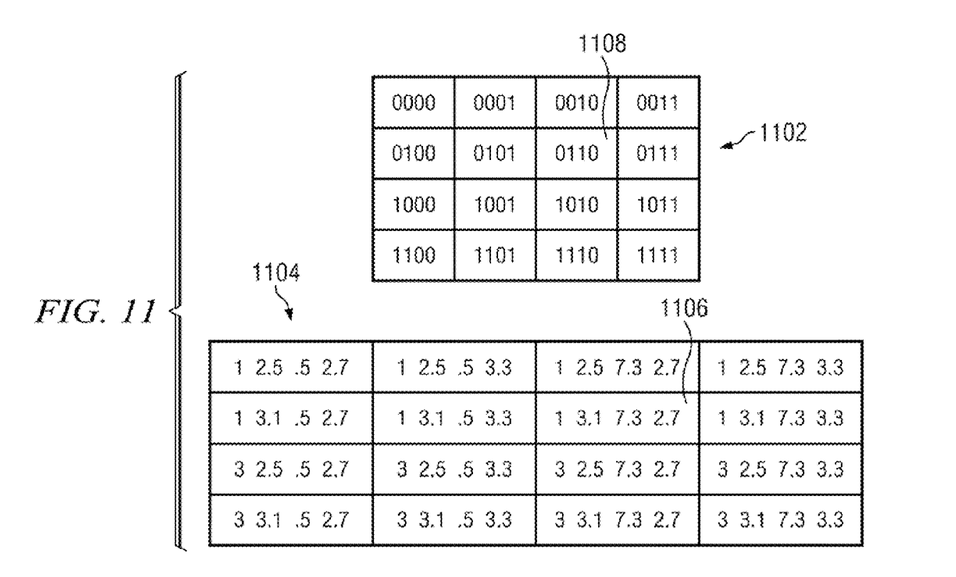
FIG. 11 illustrates the association of a digital test bench, as viewed by digital checker, to the analog test bench of FIG. 5 for the virtual analog circuit of FIG. 6, in accordance with an aspect of the present invention.

FIG. 11 illustrates the association of a digital test bench 1102 as viewed by digital checker 202 to analog test bench 500 for virtual analog circuit 600, in accordance with an aspect of the present invention.

As illustrated in the figure, values in digital test bench 1102 correspond with values in analog test bench 500.

For example, returning to FIG. 11 and referring to FIG. 6, item 1106 corresponds to an analog input value of 1 3.1 7.3 and 2.7. That is, analog signal 610 will have an analog value of 1, analog input 612 will have an analog value of 3.1, analog input 614 will have an analog value of 7.3 and analog signal 616 will have an analog value of 2.7.

The values of analog signal 610, analog signal 612, analog signal 614 and analog signal 616 will correspond to analog input 626, analog input 628, analog input 630, and analog input 632 respectively. In other words, analog input 626 will have an analog value of 1, analog input 628 will have an analog value of 3.1, analog input 630 will have an analog value of 7.3 and analog input 632 will have an analog value of 2.7.

As discussed above with reference to FIGS. 7-9, each analog input and analog output has a corresponding analog target, analog target dummy and digital target dummy. For example, analog target dummy 802 is associated with the analog target associated with analog input 626, and digital target dummy 902 is associated with analog target dummy 802.

The conjunction of an analog target dummy and its associated digital target dummy provides a conversion from an analog ON/OFF value to a digital ON/OFF value. The analog target dummies are created to associate a first predetermined analog value as an ON value and to associate a second predetermined analog value as an OFF value. For example, if item 1106 of FIG. 11, was used as an input signal to virtual analog circuit 600, analog input 626 would have a value of 1, which is predetermined to be an OFF value. The conjunction of analog target dummy 802 and digital target dummy 902 converts the value of 1 to a digital value of 0, which is checked by digital checker 202.

In other words, the digital target dummies in accordance with an aspect of the present invention provide a link between a digital checker and an analog target dummy, enabling the digital checker to monitor analog inputs.

Based on the relationship between analog targets, analog target dummies, digital target dummies and the digital checker, digital test bench 1102 is created based on analog test bench 1104. The correlation between digital test bench 1102 and analog test bench 1104 carries to the checking process, as illustrated in FIG. 12.

Figure 12:
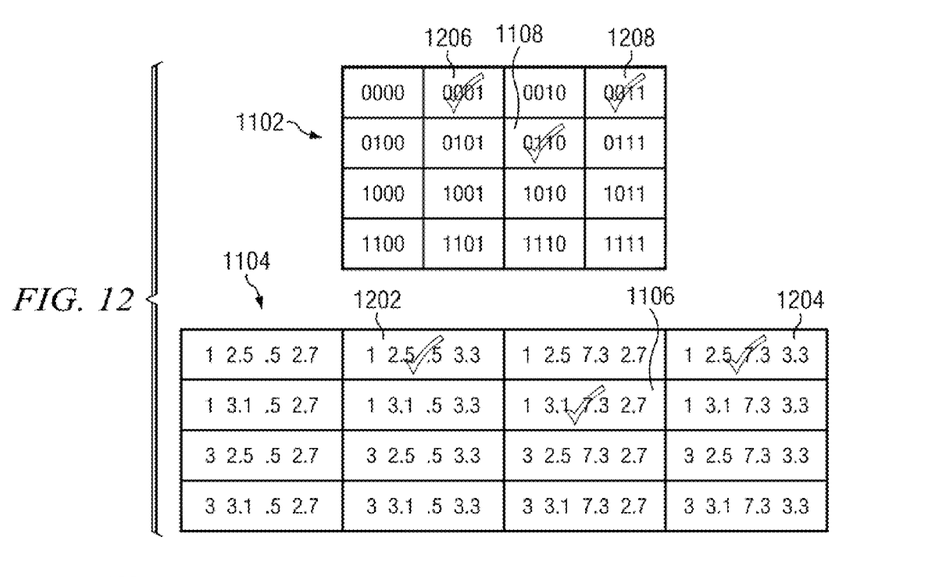
FIG. 12 illustrates the digital test bench and the analog test bench of FIG. 11 after a time t, wherein a number of analog inputs have been generated.

FIG. 12 illustrates digital test bench 1102 and analog test bench 1104 after a time t, wherein a number of analog inputs have been generated.

Specifically, in this example, assume that a pseudorandom number generator (not shown) has generated a plurality of pseudorandom input values. Of this plurality of pseudorandom analog input values, analog input values corresponding to reference number 1106, 1202 and 1204 have been generated. Further, and with reference to FIG. 11, reference numbers 1106, 1202 and 1204 will be viewed as digital input values corresponding to reference numbers 1108, 1206 and 1208, respectively, by way of a conjunction of analog target dummy/digital target dummy pairs.

After having verified that each value is provided to these inputs, the checker notes that these input values have been used. For purposes of illustration, this is indicated with check marks in FIG. 12. The corresponding analog input values in analog test bench 1104, have also been checked.

An example method of checking an analog circuit with a digital checker in accordance with an aspect of the present invention will now be described with reference to FIG. 13.

Figure 13:
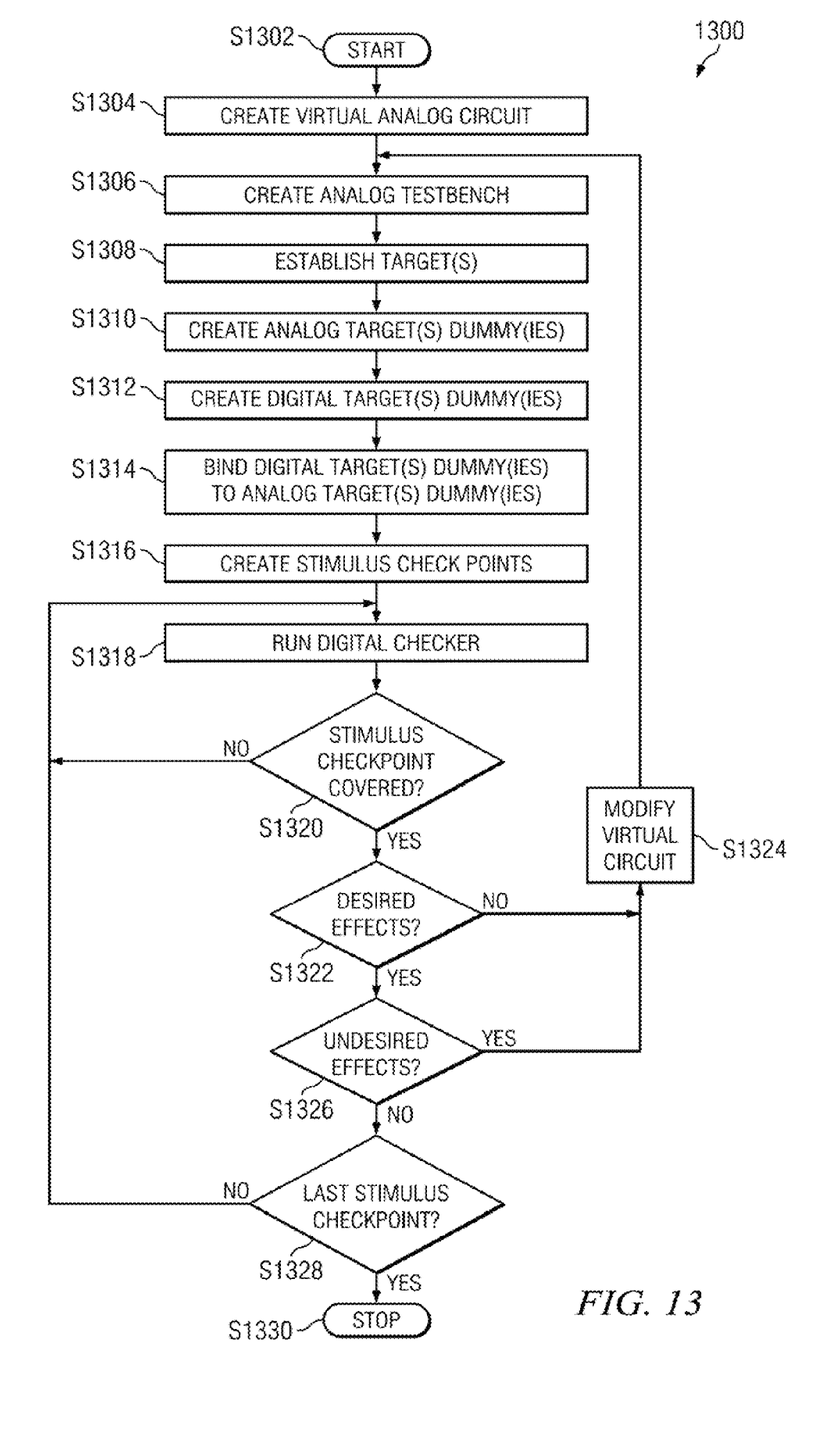
FIG. 13 illustrates an example checking process in accordance with an aspect of the present invention.

FIG. 13 illustrates an example checking process 1300, in accordance with an aspect of the present invention.

Checking process 1300 starts (S1302) and virtual analog circuit is created (S1304). Virtual analog circuit 600 will be used as reference for further discussion.

Next, a test bench is created (S1306). As previously discussed with reference to FIG. 3, the test bench is the complete set of possible input values for the circuit under test, which in this example is virtual analog circuit 600. Since the circuit under test in an analog circuit, the test bench will have analog values, for example as discussed with reference to FIG. 5.

Once the test bench is created, targets are established (S1308). These are points in the virtual circuit that are to be monitored during testing. FIG. 6 shows the locations of the analog inputs and analog outputs that are to be example analog targets for virtual analog circuit 600.

As discussed above with reference to FIG. 8, analog target dummies are created next (S1310).

As discussed above with reference to FIG. 9, digital target dummies are created next (S1312). The digital target dummies are able to translate analog values associated with analog target dummies into digital values. This provides a link between the analog target dummies and the digital checker.

Once the analog and digital target dummies have been created, they are bound together, along with the digital checker (S1314). This process is discussed above with reference to FIG. 7.

Figure 14A:
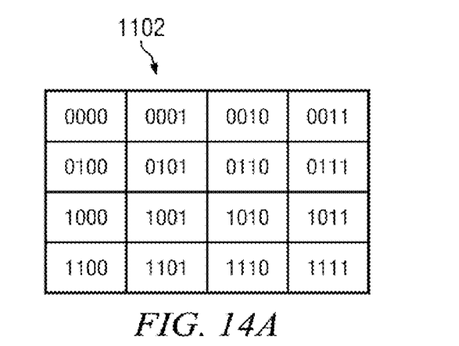
FIGS. 14A-C illustrate the digital test bench of FIG. 11, at three different times.
Figure 14B:
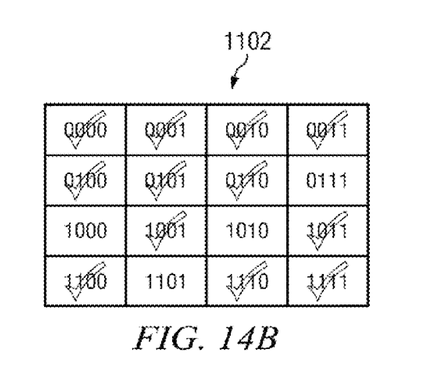
Figure 14C:
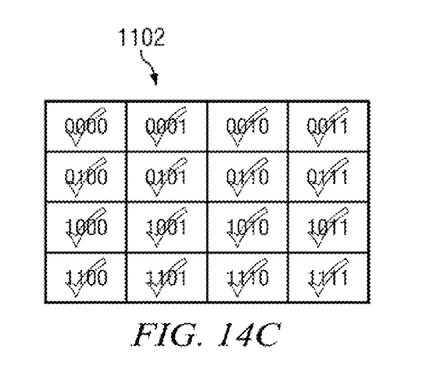

Stimulus check points may then be created (S1316). A stimulus check point corresponds to a predetermined threshold portion of the test bench. FIGS. 14A-C will be used to further explain stimulus check points.

FIG. 14A illustrates digital test bench 1102, corresponding to analog test bench 500, prior to running the digital checker.

As illustrated in FIG. 14A, none of the values in digital test bench 1102 have been checked off. As the pseudorandom number generator starts providing input valutes, input values will begin to be checked off, and eventually enough of the values will be checked off to reach a stimulus point. This will be further discussed with reference to FIG. 14B.

FIG. 14B illustrates digital test bench 1102 after 75%, or 12, of the input values have been checked off.

As illustrated in the figure, 12 of the possible input values have been applied to the circuit under test. In this example, presume that prior to initiating the checking, 75% was set as a stimulus check point.

FIG. 14C illustrates digital test bench 1102 when 100% of the input values have been checked off For purposes of discussion, in this example, presume that there are two stimulus checkpoints, a first at 75% of the stimulus and a second at 100% of the stimulus.

Returning to FIG. 13, after the checkpoints have been established, the digital checker starts checking (S1318). As discussed above, input values are provided, for example as generated by a pseudorandom number generator. The digital checker begins to monitor targets and record the values inputs that are a part of the test bench.

Returning to FIG. 10, digital checker would check input values corresponding to digital target dummies 902, 904, 906 and 908. For each input value at digital dummies 902, 904, 906 and 908, the states of the remaining digital target dummies are monitored.

For example, suppose analog input values 1 3.1 7.3 2.7 are provided to analog virtual circuit 600, wherein: analog input 610 has an analog value of 1; analog input 612 has an analog value of 3.1; analog input 614 has an analog value of 7.3; and analog input 616 has an analog value of 02.7 (as shown in item 1106 in analog test bench 1104 of FIG. 12). These analog inputs are sent through virtual analog circuit 600, which will fix each analog target in a specific state. The state of each the analog target is checked.

In particular, digital checker 202 checks the states of all the digital target dummies. In this example, the digital target dummies include digital target dummies 902, 904, 906 and 908, which digital checker 202 recognizes as inputs values. These input values must be checked against digital test bench 1102.

Further, each target within analog circuit 600 has a specific predetermined analog value corresponding to a specific set of analog input values. Because of the analog target dummy/digital target dummy association for each target, each target within analog circuit 600 has a specific predetermined digital value corresponding to a specific set of digital input values, as seen by digital checker 202.

Therefore, for each set of input values checked at digital target dummies 902, 904, 906 and 908, the corresponding states of the remaining digital target dummies are monitored. The monitored values of the remaining digital target dummies are then compared with the specific predetermined digital value corresponding thereto. In this example, for analog input values of 1 3.1 7.3 2.7, the remaining targets within analog circuit 600 will have various analog values. Digital checker 202, however, will "see" digital input values of 0110 (and will check this value off test bench 1102), at digital target dummies 902, 904, 906 and 908. Digital checker will additionally "see" digital values for the remaining digital target dummies.

It should be noted that each analog target may have its own distinct analog ON value and analog OFF value. In other words, not only is each analog target within an analog circuit not limited to having ON/OFF values of 1/0, each analog target is not limited to having ON/OFF values equal to the ON/OFF values of the input signals.

If digital checker 202 determines that the value of each of the digital target dummies is equal to the corresponding predetermined expected value of the digital target dummies corresponding to input values of 0110, it will be determined that there is no problem with analog circuit 600, for an input 0110. On the other hand, if digital checker 202 determines that the value of at least one of the digital target dummies is not equal to the corresponding predetermined expected value of the digital target dummies corresponding to input values of 0110, it will be determined that there is a problem with analog circuit 600, for an input 0110.

As the digital checker runs, the system checks to see if a stimulus check point has been reached (S1320). If a stimulus check point is not reached, the digital checker continues to run (S1318).

Presume that after a time $t_2$, input values are checked off the stimulus as indicated in FIG. 14B. In this case, 75% of the stimulus has been checked, which in this example, is the first stimulus check point. If a stimulus check point has been reached, it is determined whether the all targets are have desired values for corresponding input values (S1322).

If any monitored digital target dummy values for any of the generated inputs were not desired, the virtual circuit must be modified (S1324) and checking process 1300 starts over (S1302).

If all monitored digital target dummy values for all of the generated inputs to this point were desired, checking process 1300 continues. At this point, it is determined whether any monitored digital target dummy values for any of the generated inputs were had any undesired effects (S1326).

Step S1326 in checking process 1300 should be distinguished from step S1322 discussed above. For example, presume digital checker 202 monitors an input value of 0110 corresponding to digital target dummies 902, 904, 906 and 908, respectively. Further, presume that for such an input, a digital value for digital target dummy 918 (corresponding to output 642 of analog circuit portion 606) is expected to be 1. If the actual monitored digital value for digital target dummy 918, as checked by way of line 1016 as illustrated in FIG. 10, is a 0, then this would not be a desired effect as checked in step S1322. This would lead to a modification of the virtual circuit (S1324). Presume now that the actual monitored digital value for digital target dummy 918, as checked by way of line 1016 as illustrated in FIG. 10, is a 1. According to the determination of step S1322, this would be a desired effect. Nevertheless, presume that the expected digital value 1 at this portion of analog circuit 600 causes an undesired effect in the operation of analog circuit 600, e.g., failure to re-latch, failure to maintain a steady state, etc. In such a case, although the monitored digital value is desired, the effect of the desired value is unwanted. It is this type of situation that is monitored in the determination of step S1326.

Returning to FIG. 13, if it is determined that there are undesired effects, virtual circuit 600 must be modified (S1324) and checking process 1300 restarts (S1302).

If there are no undesired effects, it is then determined whether all stimulus check points have been reached (S1328). As discussed above, for example with reference to FIG. 14C, this occurs when all of the possible inputs in the test bench have been tested.

If it is determined that all stimulus check points have not been reached, checking process 1300 continues to run digital checker 202 (S1318). If it is determined that all stimulus check points have been reached, checking process 1300 ends (S1330).

Some example embodiments of systems in accordance with the present invention include hardware devices operable to check analog portions of a circuit. Analog portions of a circuit may include analog portions of a wholly analog circuit, or analog portions of a mixed circuit, i.e., a circuit having analog portions and digital portions.

Some example embodiments of systems in accordance with the present invention include software products operable to check analog portions of a circuit. In these cases, a circuit may be a real circuit or a virtual circuit. Software products include device readable media having device-readable instructions stored thereon, wherein the device-readable instructions are operable to instruct a device to operate in a manner in accordance with aspects of the present invention.

In accordance with an aspect of the present invention, conventional digital checking tools may be used to verify the design of analog circuits. The example system and method outlined above provides an association between analog targets in a virtual analog circuit with conventional digital checkers. This association is created through the use of a conjunction of analog target dummies and digital target dummies. These target dummies convert analog values into digital values that digital checkers can recognize and monitor.

The example system and method in accordance with an aspect of the present invention allows circuit designers to use functions of digital checkers that are not available with conventional methods of analog circuit checking. One function is the ability to create an automated checking process, where circuit inputs are generated without circuit designer input. Another function provides the ability to ensure the entire test bench has been checked during the automated input generating process.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method comprising the steps of:
    establishing a target in an analog circuit;
    creating an analog target dummy for the target;
    creating a digital target dummy;
    binding the digital target dummy to the analog target dummy using a first simulator interface; binding a hardware digital checker to the digital target dummy using a second simulator interface; and
    checking, with the digital checker, a value of the target based on the digital target dummy.

2. The method of claim 1,
    wherein said establishing a target in the analog circuit comprises establishing a plurality of targets in the analog circuit,
    wherein said creating an analog target dummy for the target comprises creating a plurality of analog target dummies for the plurality of targets, respectively,
    wherein said creating a digital target dummy comprises creating a plurality of digital target dummies,
    wherein said binding the digital target dummy to the analog target dummy comprises binding the plurality of digital target dummies to corresponding analog target dummies, and
    wherein said checking, with a digital checker, a value of the target based on the digital target dummy comprises checking values of plurality of digital target dummies, wherein said checking comprises checking the logic through at least one of simulations, connectivity and design rules.

3. The method of claim 2, wherein said establishing a plurality of targets in the analog circuit comprises establishing one target as an input of the analog circuit.

4. The method of claim 3, further comprising creating a test bench of possible input values for the one target as the input of the analog circuit.

5. The method of claim 4, further comprising establishing a stimulus checkpoint corresponding to a portion of the test bench.

6. The method of claim 5, further comprising providing generated input values to the one target as the input of the analog circuit.

7. The method of claim 6, further comprising determining whether the stimulus checkpoint has been reached based on the generated input values.

8. The method of claim 7, further comprising:
    checking values of another of the plurality of targets in the analog circuit corresponding to the generated input values; and
    determining whether the checked values of the another of the plurality of targets are equal to corresponding predetermined acceptable values.

9. The method of claim 8, further comprising determining whether the checked values of the another of the plurality of targets produce an undesired effect in the analog circuit.

10. The method of claim 9, further comprising modifying the circuit when it is determined that one of the checked values of the another of the plurality of targets does not equal the corresponding predetermined acceptable value or when one checked value of the another of the plurality of targets produces an undesired effect in the analog circuit.

11. The method of claim 1, wherein the first simulator interface binding the digital target dummy to the analog target dummy is a mixed signal simulator interface.

12. A non-transitory device-readable media having device-readable instructions stored thereon, the device-readable instructions being capable of instructing a device to perform a method of checking a portion of an analog circuit, said method comprising:
    establishing a target in the analog circuit;
    creating an analog target dummy for the target;
    creating a digital target dummy;
    binding the digital target dummy to the analog target dummy using a first simulator interface; binding a hardware digital checker to the digital target dummy using a second simulator interface; and
    checking, with a digital checker, a value of the target based on the digital target dummy.

13. The device-readable media of claim 12,
    wherein the device-readable instructions being capable of instructing a device to perform said establishing a target in the analog circuit comprises device-readable instructions being capable of instructing the device to establish a plurality of targets in the analog circuit,
    wherein the device-readable instructions being capable of instructing a device to perform creating an analog target dummy for the target comprises device-readable instructions being capable of instructing the device to create a plurality of analog target dummies for the plurality of targets, respectively,
    wherein the device-readable instructions being capable of instructing a device to perform creating a digital target dummy comprises device-readable instructions being capable of instructing the device to create a plurality of digital target dummies,
    wherein the device-readable instructions being capable of instructing a device to perform binding the digital target dummy to the analog target dummy comprises device-readable instructions being capable of instructing the device to bind the plurality of digital target dummies to corresponding analog target dummies, and
    wherein the device-readable instructions being capable of instructing a device to perform checking, with a digital checker, a value of the digital target dummy comprises device-readable instructions being capable of instructing the device to check values of the plurality of digital target dummies, wherein said checking comprises checking the logic through at least one of simulations, connectivity and design rules.

14. The device-readable media of claim 13, wherein the device-readable instructions being capable of instructing a device to perform establishing a plurality of targets in the analog circuit comprises device-readable instructions being capable of instructing the device to establish one target as an input of the analog circuit.

15. The device-readable media of claim 14, further comprising device-readable instructions being capable of instructing the device to create a test bench of possible input values for the one target as the input of the analog circuit.

16. The device-readable media of claim 15, further comprising device-readable instructions being capable of instructing the device to establish a stimulus checkpoint corresponding to a portion of the test bench.

17. The device-readable media of claim 16, further comprising device-readable instructions being capable of instructing the device to provide generated input values to the one target as the input of the analog circuit.

18. The device-readable media of claim 17, further comprising device-readable instructions being capable of instructing the device to determine whether the stimulus checkpoint has been reached based on the generated input values.

19. The device-readable media of claim 18, further comprising device-readable instructions being capable of instructing the device to:
   check values of another of the plurality of targets in the analog circuit corresponding to the generated input values; and
   determine whether the checked values of the another of the plurality of targets are equal to corresponding predetermined acceptable values.

20. The device-readable media of claim 19, further comprising device-readable instructions being capable of instructing the device to determine whether the checked values of the another of the plurality of targets produce an undesired effect in the analog circuit.

21. The device-readable media of claim 20, further comprising device-readable instructions being capable of instructing the device to modify the circuit when it is determined that one of the checked values of the another of the plurality of targets does not equal the corresponding predetermined acceptable value or when one checked value of the another of the plurality of targets produces an undesired effect in the analog circuit.

22. The device-readable media of claim 12, wherein the first simulator interface binding the digital target dummy to the analog target dummy is a mixed signal simulator interface.

* * * * *